US012696603B2

(12) United States Patent
Guo et al.

(10) Patent No.: US 12,696,603 B2
(45) Date of Patent: Jul. 28, 2026

(54) LED SUPPORT, PREPARATION METHOD THEREOF, AND DEVICE

(71) Applicant: FOSHAN NATIONSTAR OPTOELECTRONICS CO., LTD., Foshan (CN)

(72) Inventors: Haojie Guo, Foshan (CN); Mingjun Zhu, Foshan (CN); Yurong Li, Foshan (CN); Jiaer Mai, Foshan (CN); Canbiao Wu, Foshan (CN); Danwei Li, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 385 days.

(21) Appl. No.: 18/516,594

(22) Filed: Nov. 21, 2023

(65) Prior Publication Data

US 2024/0170630 A1     May 23, 2024

(30) Foreign Application Priority Data

Nov. 23, 2022     (CN) .......................... 202211475090.0

(51) Int. Cl.
    H10H 20/858     (2025.01)
    H10H 20/857     (2025.01)
    *H10H 20/01*     (2025.01)

(52) U.S. Cl.
    CPC ...... H10H 20/8583 (2025.01); H10H 20/857 (2025.01); *H10H 20/0365* (2025.01)

(58) Field of Classification Search
    CPC .......... H10H 20/0365; H10H 20/8506; H10H 20/857; H10H 20/8581; H10H 20/8582; H10H 20/8583
    See application file for complete search history.

(56) References Cited

U.S. PATENT DOCUMENTS

2011/0241025 A1 * 10/2011 Sakamoto .......... H10H 20/8506
    257/E33.056
2024/0162393 A1 * 5/2024 Ko ..................... H10H 20/8514

* cited by examiner

*Primary Examiner* — Hoai V Pham
(74) *Attorney, Agent, or Firm* — CM Law; Stephen J. Weed

(57) ABSTRACT

Provided is an LED support. The LED support includes a substrate, an inner electrode, a heat dissipation pad, an electrode pad, and a solder resist layer. The electrode pad includes a top connection layer and a bottom electrode layer that are laminated. The top connection layer is connected to the back of the substrate and is provided with a connection portion extending toward the heat dissipation pad and connected to the conductive through hole in the substrate. The connection portion is between the heat dissipation pad and the bottom electrode layer. The spacing between the bottom electrode layer and the heat dissipation pad is greater than the spacing between the connection portion and the heat dissipation pad. The solder resist layer is filled in a groove formed between the electrode pad and the heat dissipation pad on the back of the substrate, and covers the connection portion.

19 Claims, 4 Drawing Sheets

LED SUPPORT, PREPARATION METHOD THEREOF, AND DEVICE

CROSS-REFERENCE TO RELATED APPLICATIONS

This disclosure claims priority to Chinese Patent Application No. 202211475090.0 filed Nov. 23, 2022, the disclosure of which is incorporated herein by reference in its entirety.

TECHNICAL FIELD

The present disclosure relates to the technical field of LEDs, and in particular, to an LED support, a preparation method thereof, and a device.

BACKGROUND

With the rapid development, ultraviolet LEDs replace traditional mercury lamps at an accelerating speed, and the use scope of the ultraviolet LEDs is increasingly wide. Due to the high power and low light efficiency of ultraviolet LED devices, a support with a ceramic substrate and a metal box dam is generally adopted to achieve a good heat dissipation effect.

FIGS. 1A and 1B show an existing ultraviolet LED support including a ceramic substrate 1', a metal box dam 2', an inner electrode 3', a heat dissipation pad 4', and two electrode pads 5'. Since the inner electrode 3' needs to be separated from the metal box dam 2' by a certain distance, the position of a conductive through hole 30' leading the inner electrode 3' on the front to the electrode pad 5' on the back needs to be arranged inwardly, which results in a reduction of the area of the heat dissipation pad 4' in the middle to avoid a short circuit caused by contact with the conductive through holes 30' on two sides. As a result, the heat dissipation effect of the heat dissipation pad 4' is reduced. Moreover, the spacing L between the heat dissipation pad 4' and the electrode pad 5' on each of two sides of the heat dissipation pad 4' needs to be large enough to prevent solder (for example, solder paste) from moving inwardly from the electrode pad 5' to the heat dissipation pad 4' to cause a soldering short circuit when the device is soldered, which also requires sacrificing the area and the heat dissipation effect of the heat dissipation pad 4'. In addition, other types of LED devices with heat dissipation pads on the bottom also have similar problems.

SUMMARY

In view of this, the present disclosure provides an LED support. The support can not only reduce soldering short circuits but also ensure the area of the heat dissipation pad, which is conductive to improving the heat dissipation performance.

The technical solutions adopted by the present disclosure are described below.

A light-emitting diode (LED) support includes a substrate, an inner electrode, a heat dissipation pad, an electrode pad, and a solder resist layer.

The substrate is provided with a conductive through hole. The inner electrode is disposed on a front of the substrate and connected to the conductive through hole. The heat dissipation pad is disposed on a back of the substrate.

The electrode pad is disposed on the back of the substrate and separated from the heat dissipation pad. The electrode pad includes a top connection layer and a bottom electrode layer that are laminated, the top connection layer is connected to the back of the substrate and is provided with a connection portion extending toward the heat dissipation pad and connected to the conductive through hole, the connection portion is located between the bottom electrode layer and the heat dissipation pad, and a spacing between the bottom electrode layer and the heat dissipation pad is greater than a spacing between the connection portion and the heat dissipation pad.

The solder resist layer is filled in a groove formed between the electrode pad and the heat dissipation pad on the back of the substrate, and covers the connection portion.

Compared with the related art, the present disclosure has a design that the electrode pad includes a structure of a top connection layer connecting to the conductive through hole and a bottom electrode layer. The bottom electrode layer provides a longer surface spacing between the electrode pad and the heat dissipation pad, which can effectively prevent the solder from moving from the electrode pad to the heat dissipation pad to cause a short circuit when the device is soldered. Moreover, the filled solder resist layer can effectively block the heat dissipation pad and the inwardly-extending connection portion of the top connection layer so that the spacing between the heat dissipation pad and the connection portion can be reduced as much as possible to ensure the maximum area of the heat dissipation pad, which is conductive to improving the heat dissipation performance and prolonging the service life of the device.

In an embodiment, the surface width of the solder resist layer is greater than 150 microns. Under this condition, a movement distance is reserved for the solder paste, which can prevent the solder paste from moving from the bottom electrode layer to the heat dissipation pad to cause a short circuit.

In an embodiment, the surface width of the solder resist layer is greater than or equal to the sum of the spacing between the connection portion and the heat dissipation pad and the diameter of the conductive through hole.

In an embodiment, the spacing between the front edge of the conductive through hole and the outer edge of the inner electrode to which the conductive through hole is connected is no less than 50 microns. In this manner, it is ensured that the conductive through hole obtained under a certain manufacturing tolerance can be connected to the inner electrode.

In an embodiment, the connection portion is a protruding portion protruding and extending from one side of the top connection layer toward the heat dissipation pad to cover the conductive through hole.

In an embodiment, the distance of the edge of the connection portion beyond the back edge of the conductive through hole covered by the connection portion is no less than 50 microns. In this manner, it is ensured that the connection portion obtained under a certain manufacturing tolerance can completely cover the conductive through hole.

In an embodiment, the spacing between a portion of the top connection layer other than the connection portion and the heat dissipation pad is equal to the spacing between the bottom electrode layer and the heat dissipation pad.

In an embodiment, the thickness of the top connection layer is less than the thickness of the bottom electrode layer.

In an embodiment, the thickness of the heat dissipation pad is the same as the thickness of the electrode pad.

In an embodiment, the spacing between the connection portion and the heat dissipation pad is between 50 microns and 100 microns. This is the smallest distance that can be achieved by the existing manufacturing process to ensure the maximum area of the heat dissipation pad.

In an embodiment, the LED support also includes a box dam disposed on the front of the substrate to form an inner cavity. The inner electrode is located in the inner cavity and separated from the box dam.

The present disclosure also provides an LED device. The device includes the LED support and an LED chip disposed on the inner electrode.

Figure 1A:
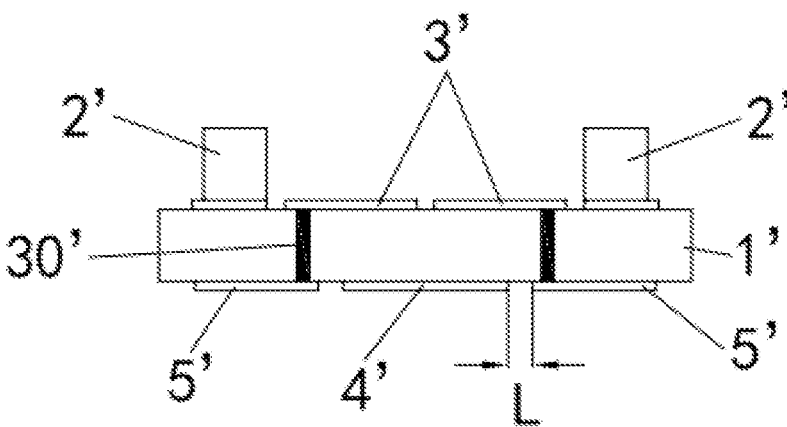
FIG. 1A is a view of an existing ultraviolet LED support.
Figure 1B:
FIG. 1B is a rear view of the ultraviolet LED support of FIG. 1A.
Figure 1B:
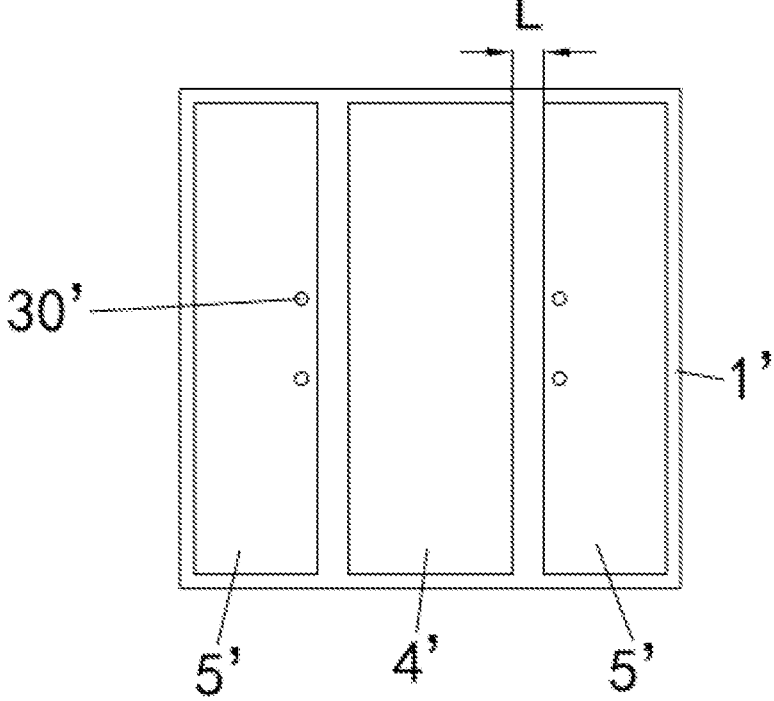

REFERENCE LIST 1 substrate
2 box dam
20 peripheral line
20A missing corner
3 inner electrode
30 conductive through hole
4 heat dissipation pad
5 electrode pad
51 top connection layer
52 bottom electrode layer
53 connection portion
6 solder resist layer
7 LED chip
8 lens
9 glue
C inner cavity
L1 spacing between the bottom electrode layer and the heat dissipation pad
L2 spacing between the connection portion and the heat dissipation pad
$d_1$ spacing between the front edge of the conductive through hole and the outer edge of the inner electrode
$d_2$ distance of the edge of the connection portion beyond the back edge of the conductive through hole covered by the connection portion

DETAILED DESCRIPTION

As shown in FIGS. 2 to 5, the LED support of the present disclosure includes a substrate 1, a box dam 2, an inner electrode 3, a heat dissipation pad 4, two electrode pads 5, two solder resist layers 6, and a peripheral line 20.

The box dam 2 is disposed on the front of the substrate 1 to form an inner cavity C. The top of the box dam 2 is provided with double steps.

The inner electrode 3, located in the inner cavity C, is disposed on the front surface of the substrate 1 and separated from the box dam 2. Specifically, two inner electrodes 3 are provided and separated from each other in the middle of the front of the substrate 1 side by side.

The peripheral line 20 is disposed on the front of the substrate 1, and surrounds and connects to the box dam 2. The outer edge of the peripheral line 20 is a square with a missing corner 20A as a sign for polarity identification.

The heat dissipation pad 4, two electrode pads 5, and two solder resist layers 6 are all disposed on the back of the substrate 1. The heat dissipation pad 4 is located in the middle of the substrate 1 for conducting the heat generated by a chip to the outside. The two electrode pads 5 are located on two sides of the heat dissipation pad 4 respectively and separated from the heat dissipation pad 4.

Conductive through holes 30 on two sides of the heat dissipation pad 4 are disposed on the substrate 1. The conductive through hole 30 is connected to the edge of the inner electrode 3. A conductive post is filled in the conductive through hole 30. The conductive through hole 30 generally penetrates the front and back of the substrate 1 in the direction of the thickness of the substrate 1 and is generally a circular through hole.

Figure 2:
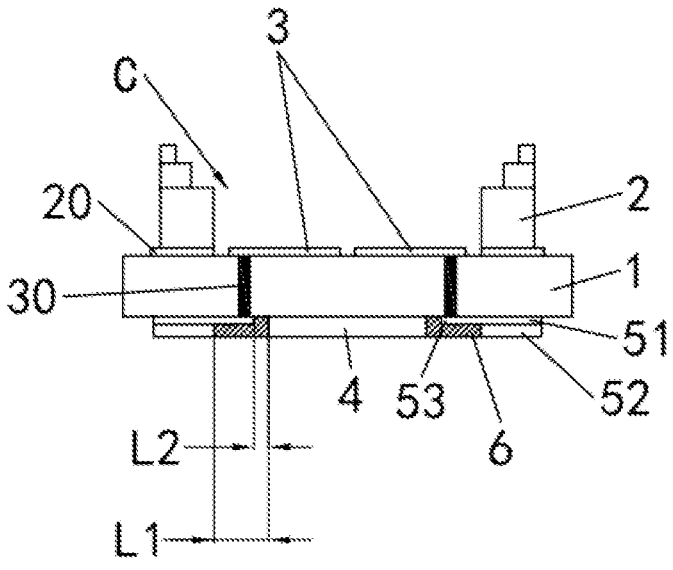
FIG. 2 is a view of an LED support according to the present disclosure.
Figure 4:
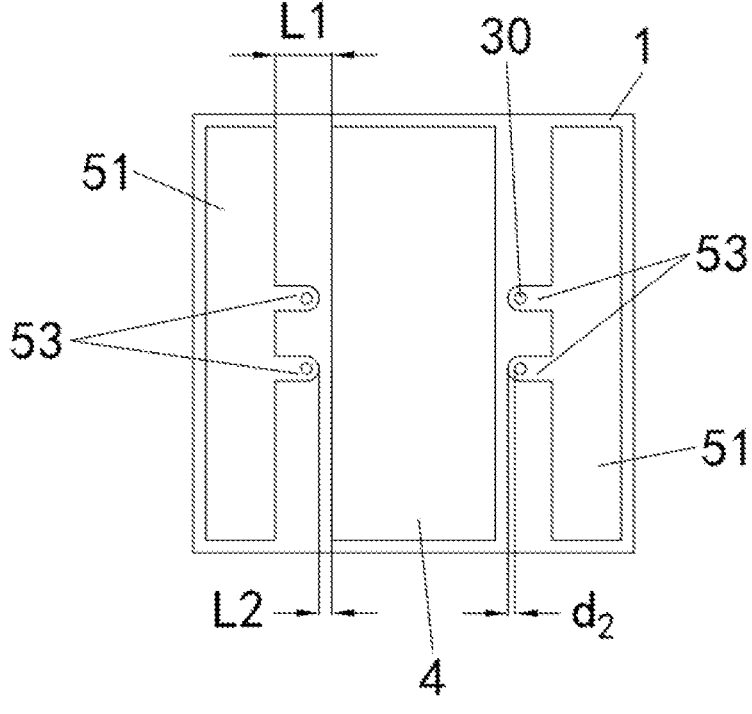
FIG. 4 is a rear view of the LED support of FIG. 2 in which a solder resist layer and a bottom electrode layer are removed.

Referring to FIGS. 2 and 4, the electrode pad 5 includes a top connection layer 51 and a bottom electrode layer 52 that are laminated. The top connection layer 51 is connected to the back of the substrate 1 and is provided with a connection portion 53 extending toward the heat dissipation pad 4 and connected to the conductive through hole 30. The connection portion 53 is located between the heat dissipation pad 4 and the bottom electrode layer 52. The spacing L1 between the bottom electrode layer 52 and the heat dissipation pad 4 is greater than the spacing L2 between the connection portion 53 and the heat dissipation pad 4.

Figure 5:
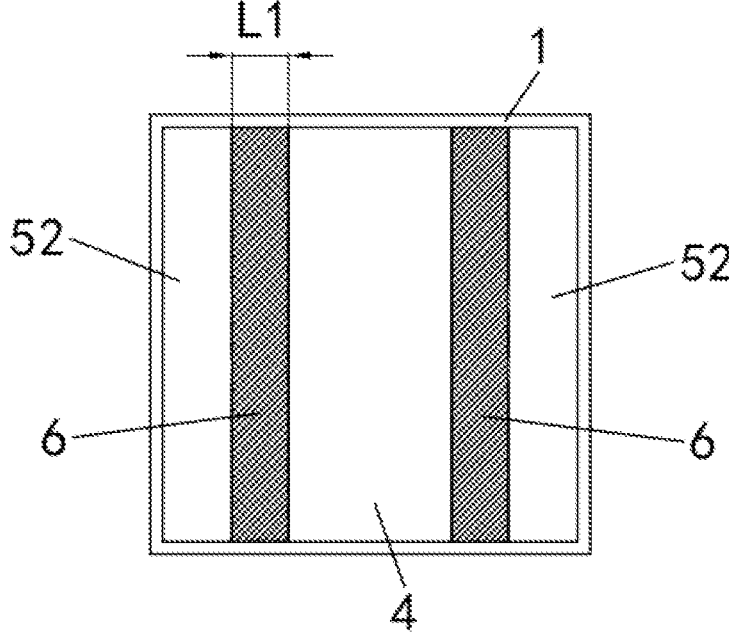
FIG. 5 is a rear view of the LED support of FIG. 2.

The solder resist layer 6 is filled in a groove formed between the electrode pad 5 and the heat dissipation pad 4 on the back of the substrate 1, and covers the connection portion 53 of the electrode pad 5, as shown in FIGS. 4 and 5.

In an embodiment, the surface width L1 of the solder resist layer 6 is greater than 150 microns, that is, the spacing L1 between the bottom electrode layer 52 of the electrode pad 5 and the heat dissipation pad 4 needs to be greater than 150 microns. Under this condition, a short circuit caused by solder paste moving from the bottom electrode layer 52 to the heat dissipation pad 4 can be minimized. In an embodiment, the surface width L1 of the solder resist layer 6 is between 200 microns to 600 microns. In an embodiment, the surface width L1 of the solder resist layer 6 is between 350 microns to 500 microns, which is better compatible with the market pad size.

The surface width L1 of the solder resist layer 6 is greater than or equal to the sum of the spacing L2 between the connection portion 53 and the heat dissipation pad 4 and the diameter of the conductive through hole 30, as shown in FIGS. 2 and 4. The diameter of the conductive through hole 30 is typically between 0.05 mm to 0.1 mm.

Figure 3:
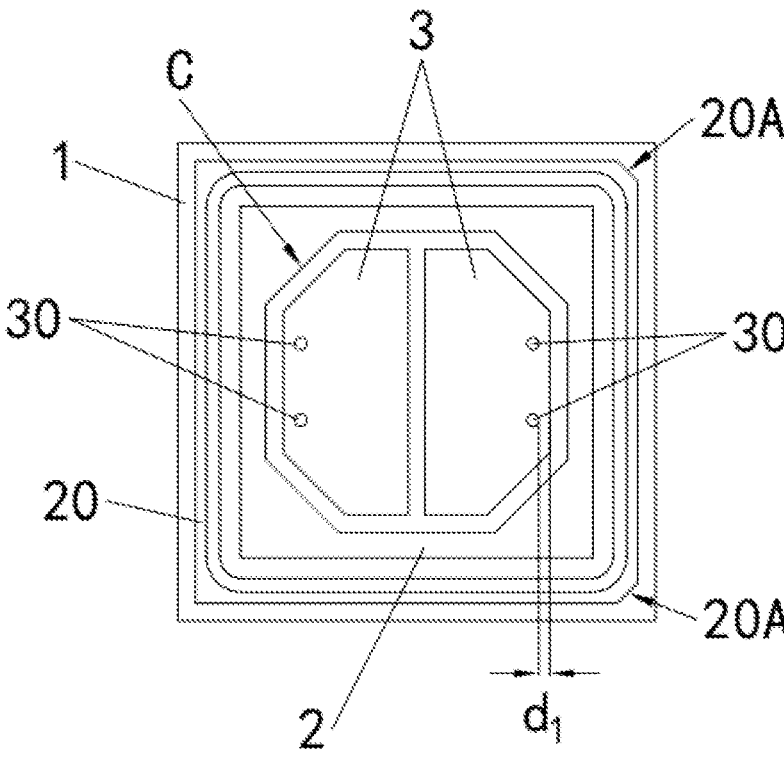
FIG. 3 is a front view of the LED support of FIG. 2.

Considering the tolerance in the electroplating process, as shown in FIG. 3, the distance $d_1$ between the front edge of the conductive through hole 30 and the outer edge of the inner electrode 3 is no less than 50 microns, preferably 50 microns to 100 microns. If $d_1$ is less than 50 microns, it is likely that the conductive through hole 30 will not come into contact with the inner electrode with a large tolerance.

To control the cost and fill the solder resist layer 6, the thickness of the bottom electrode layer 52 of the electrode pad 5 is between 50 microns to 150 microns, which is a suitable thickness range. If the bottom electrode layer 52 is too thick, the cost is increased excessively, and if the bottom electrode layer 52 is too thin, a groove formed for filling the solder resist layer 6 will be to too small and shallow, making it impossible for the solder resist ink to fill the groove by the printing process. The top electrode layer 51 may adopt the thickness range of conventional electrode pads, typically 30 microns to 80 microns. In an embodiment, the thickness of the top electrode layer 51 or the connection portion 53 is smaller than the thickness of the bottom electrode layer 52. As shown in FIG. 2, the narrowest gap of the groove whose width is the spacing L2 is not too deep, so that the solder resist ink can easily fill the narrowest gap. The thicker bottom electrode layer 52 can store more heat and has a larger contact area with the solder resist ink, which is conductive to enhancing the bonding reliability between the solder resist layer 6 and the electrode pad 5.

The thickness of the heat dissipation pad 4 is the same as the thickness of the electrode pad 5, that is, the bottom surface of the heat dissipation pad 4 is flush with the bottom surface of the electrode pad 5 and is flush with the surface of the solder resist layer 6.

The spacing L2 between the connection portion 53 of the electrode pad 5 and the heat dissipation pad 4 is between 50 microns and 100 microns, ensuring the maximum area of the heat dissipation pad 4. The width of the heat dissipation pad 4 accounts for about 20% to 50% of the total width of the back of the LED support. In the case of meeting requirements of the provision of the electrode pads 5 on two sides and filling of the solder resist layer 6, the wider the width of the heat dissipation pad 4 is, the better it is, so as to obtain a larger heat dissipation area as much as possible.

The substrate 1 is ceramic. The box dam 2, the inner electrode 3, the heat dissipation pad 4, the electrode pad 5, the peripheral line 20, and the conductive post in the conductive through hole 30 are all metal, preferably copper. The solder resist layer 6 is solder resist ink (green oil).

In an illustrated embodiment of the present disclosure, four conductive through holes 30 are divided into two pairs that are disposed on two sides of the heat dissipation pad 4 respectively and connected to the edges of the two inner electrodes 3 respectively. In other embodiments, other numbers of conductive through hole 30 may be provided, or the conductive through hole 30 are arranged in other manners.

In an illustrated embodiment of the present disclosure, as shown in FIG. 4, the connection portion 53 is a protruding portion protruding and extending from one side of the top connection layer 51 toward the heat dissipation pad 4 to cover the conductive through hole 30. Specifically, the protruding portion is in a long strip shape with a semicircular end, and covers the conductive through hole 30. The spacing between a portion of the top connection layer 51 other than the connection portion 53 and the heat dissipation pad 4 is equal to the spacing L1 between the bottom electrode layer 52 and the heat dissipation pad 4. Therefore, on the one hand, only the connection portion 53 with a small area is provided in the top electrode layer 51 to be connected to the conductive through hole 30 to achieve electrical conduction, so that the larger-area portion other than the connection portion 53 is not too close to the heat dissipation pad 4. In this manner, a short circuit caused by metal easily overflowing to heat dissipation pad 4 due to poor electroplating during production is avoided, the risk of short circuits is greatly reduced, and the production yield is improved. On the other hand, the metal material unnecessary for producing the top connection layer 51 is saved.

In other embodiments, the connection portion 53 may be in other regular or irregular shapes and may cover more part of the back of the substrate 1, which, however, may increase the risk of short circuits caused by poor electroplating and the cost of the metal material.

Considering the tolerance in the electroplating process, as shown in FIG. 4, the distance $d_2$ of the edge of the connection portion 53 beyond the back edge of the conductive through hole 30 covered by the connection portion 53 is no less than 50 microns. If $d_2$ is less than 50 microns, the connection portion 53 may not cover the conductive through hole 30 completely at a larger tolerance.

Figure 6:
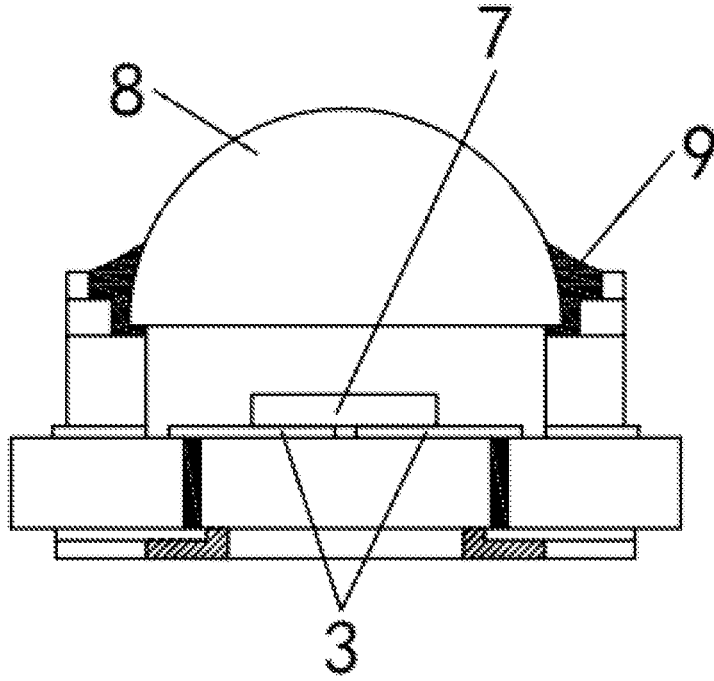
FIG. 6 is a rear view of an LED device according to the present disclosure.

As shown in FIG. 6, the LED device of the present disclosure includes the LED support, an LED chip 7, and a lens 8. The LED chip 7 is disposed on the inner electrode 3, specifically, flipped on the inner electrode 3. The lens 8 is bonded and packaged to double steps at the top of the box dam 2 by glue 9. Specifically, the LED chip 7 may be an ultraviolet LED chip, and the LED device is an ultraviolet LED device. The glue 9 may be anti-ultraviolet glue, preferably a methyl silicon material.

The preparation method for the LED support includes substrate drilling, electroplating lines (the lines include the inner electrode 3, heat dissipation pad 4, electrode pad 5. and peripheral line 20) and the box dam 2, electroplating filling holes, filling the solder resist layers 6, and other steps, which are roughly the same as those of the conventional process. The method has the following features: when the electrode pad 5 is prepared by electroplating, the top connection layer 51 with the connection portion 53 is electroplated first, the connection portion 53 is pressed and covered by a mold, and then the bottom electrode layer 52 is electroplated on an exposed portion of the bottom surface of the top connection layer 51 that is not pressed and covered to obtain the electrode pad 5 with the preceding structure. Meanwhile, the heat dissipation pad 4 and the electrode pad 5 are electroplated together to form the same thickness. The step of filling the solder resist layer 6 adopts a stencil printing process.

Compared with the related art, the present disclosure has a design that the electrode pad 5 includes a structure of the top connection layer 51 connecting to the conductive through hole 30 and the bottom electrode layer 52. The bottom electrode layer 52 provides a longer surface spacing L1 between the electrode pad 5 and the heat dissipation pad 4, which can effectively prevent solder from moving from the electrode pads 5 on two sides to the heat dissipation pad 4 in the middle to cause a short circuit when the device is soldered. Moreover, the filled solder resist layer 6 can effectively block the heat dissipation pad 4 and the inwardly-extending connection portion 53 of the top connection layer 51. The spacing L2 between the heat dissipation pad 4 and the connection portion 53 can be reduced as much as possible to ensure the maximum area of the heat dissipation pad 4. In this manner, it is conductive to improving the heat dissipation performance and prolong the service life of the device.

By minor change of the electrode pad 5 (i.e., adding the bottom electrode layer 52) and filling of the solder resist layer 6, the present disclosure cleverly solves the problem in the related art that the area of the heat dissipation pad needs to be sacrificed to avoid solder movement and short circuits. Meanwhile, it is not necessary to redesign other components in the support or greatly adjust the preparation process of the support. The improvement cost is low, and an electroplated bottom electrode layer 52 and a filling solder resist layer 6 can be directly added to the existing LED support (such as the existing support shown in FIG. 1A) to obtain the LED support of the present disclosure.

The ultraviolet LED device with the LED support in the present disclosure is compared with the existing ultraviolet LED device with the support in FIG. 1A. The total thickness of the electrode pad in the ultraviolet LED device of the present disclosure is 333.36 microns, and the total thermal resistance of the device is only 32.980 K/W; the thickness of the electrode pad in the existing ultraviolet LED device with the support in FIG. 1A is 161.15 microns, and the total thermal resistance of the device reaches 38.592 K/W. The comparison showed that in the present disclosure, the addition of the bottom electrode layer to the electrode pad can ensure the maximum area of the heat dissipation pad and improve the heat dissipation performance.

The preceding embodiments are merely several embodiments of the present disclosure. It is to be noted that for those of ordinary skill in the art, a number of improvements and modifications can be made without departing from the principle of the present disclosure.

What is claimed is:

1. A light-emitting diode (LED) support, comprising:
a substrate provided with a conductive through hole;
an inner electrode disposed on a front of the substrate and connected to the conductive through hole;
a heat dissipation pad disposed on a back of the substrate;
an electrode pad disposed on the back of the substrate and separated from the heat dissipation pad, wherein the electrode pad comprises a top connection layer and a bottom electrode layer that are laminated, the top connection layer is connected to the back of the substrate and is provided with a connection portion, the connection portion extends toward the heat dissipation pad, is connected to the conductive through hole, and is located between the bottom electrode layer and the heat dissipation pad, and a spacing between the bottom electrode layer and the heat dissipation pad is greater than a spacing between the connection portion and the heat dissipation pad; and
a solder resist layer, which is filled in a groove formed between the electrode pad and the heat dissipation pad on the back of the substrate, and covers the connection portion.

2. The LED support of claim 1, wherein a surface width of the solder resist layer is greater than 150 microns.

3. The LED support of claim 2, wherein the surface width of the solder resist layer is greater than or equal to a sum of the spacing between the connection portion and the heat dissipation pad and a diameter of the conductive through hole.

4. The LED support of claim 1, wherein a spacing between a front edge of the conductive through hole and an outer edge of the inner electrode to which the conductive through hole is connected is no less than 50 microns.

5. The LED support of claim 1, wherein the connection portion is a protruding portion protruding and extending from one side of the top connection layer toward the heat dissipation pad to cover the conductive through hole.

6. The LED support of claim 5, wherein a distance of an edge of the connection portion beyond a back edge of the conductive through hole covered by the connection portion is no less than 50 microns.

7. The LED support of claim 5, wherein a spacing between a portion of the top connection layer other than the connection portion and the heat dissipation pad is equal to the spacing between the bottom electrode layer and the heat dissipation pad.

8. The LED support of claim 1, wherein a thickness of the top connection layer is less than a thickness of the bottom electrode layer.

9. The LED support of claim 1, wherein a thickness of the heat dissipation pad is the same as a thickness of the electrode pad.

10. The LED support of claim 1, wherein the spacing between the connection portion and the heat dissipation pad is between 50 microns and 100 microns.

11. The LED support of claim 1, further comprising a box dam disposed on the front of the substrate to form an inner cavity, wherein the inner electrode is located in the inner cavity and separated from the box dam.

12. An LED device, comprising the LED support of claim 1 and an LED chip disposed on the inner electrode.

13. The LED device of claim 12, wherein a surface width of the solder resist layer is greater than 150 microns.

14. The LED device of claim 13, wherein the surface width of the solder resist layer is greater than or equal to a sum of the spacing between the connection portion and the heat dissipation pad and a diameter of the conductive through hole.

15. The LED device of claim 12, wherein a spacing between a front edge of the conductive through hole and an outer edge of the inner electrode to which the conductive through hole is connected is no less than 50 microns.

16. The LED device of claim 12, wherein the connection portion is a protruding portion protruding and extending from one side of the top connection layer toward the heat dissipation pad to cover the conductive through hole.

17. The LED device of claim 16, wherein a distance of an edge of the connection portion beyond a back edge of the conductive through hole covered by the connection portion is no less than 50 microns.

18. The LED device of claim 16, wherein a spacing between a portion of the top connection layer other than the connection portion and the heat dissipation pad is equal to the spacing between the bottom electrode layer and the heat dissipation pad.

19. The LED device of claim 12, wherein a thickness of the top connection layer is less than a thickness of the bottom electrode layer.

* * * * *